(12) United States Patent
Gilliland et al.

(10) Patent No.: US 9,920,849 B2
(45) Date of Patent: Mar. 20, 2018

(54) RESILIENT DEFORMABLE AIR VALVE

(71) Applicant: International Business Machines Corporation, Armonk, NY (US)

(72) Inventors: Don A. Gilliland, Rochester, MN (US); Dennis J. Wurth, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 16 days.

(21) Appl. No.: 15/158,211

(22) Filed: May 18, 2016

(65) Prior Publication Data

US 2016/0258545 A1    Sep. 8, 2016

Related U.S. Application Data

(62) Division of application No. 14/168,750, filed on Jan. 30, 2014, now abandoned.

(51) Int. Cl.
*F16K 15/14* (2006.01)
*H05K 9/00* (2006.01)
*H05K 7/20* (2006.01)

(52) U.S. Cl.
CPC ....... *F16K 15/144* (2013.01); *H05K 7/20736* (2013.01); *H05K 9/0041* (2013.01)

(58) Field of Classification Search
CPC ........... H05K 7/20145; H05K 7/20209; H05K 7/20181; H05K 7/20736; H05K 9/0041; F16K 15/144; F16K 15/147

USPC .......... 137/601.2; 138/45; 361/693; 251/212
See application file for complete search history.

(56) References Cited

U.S. PATENT DOCUMENTS

| 2,593,315 | A  | 4/1952  | Kraft              |
|-----------|----|---------|--------------------|
| 3,566,902 | A  | 3/1971  | Muller             |
| 4,690,245 | A  | 9/1987  | Gregorich et al.   |
| 6,375,155 | B1 | 4/2002  | Janssens           |
| 7,431,638 | B2 | 10/2008 | Natsume et al.     |
| 8,316,820 | B1 | 11/2012 | Cammarata          |
| 2009/0002949 | A1 | 1/2009 | Pawlenko et al.   |
| 2010/0155025 | A1 | 6/2010 | Jewell-Larsen et al. |
| 2011/0241932 | A1 | 10/2011 | Rowe              |
| 2011/0303864 | A1 | 12/2011 | Lee               |
| 2012/0190289 | A1 | 7/2012  | Wei               |
| 2012/0255274 | A1 | 10/2012 | Hummel et al.     |
| 2015/0216076 | A1 | 7/2015  | Gilliland et al.  |

*Primary Examiner* — Kevin Murphy
*Assistant Examiner* — Paul J Gray
(74) *Attorney, Agent, or Firm* — Jared L. Montanaro

(57) ABSTRACT

An air valve may include a sheet on a panel that serves as a portion of one wall of an air-cooled enclosure. The panel has a first aperture, having a first radius. The sheet may be deformable and resilient, and have a conductive film on one surface and a second aperture. A plurality of leaves lie in a plane parallel to the panel and extend inwardly a particular distance from a perimeter define the second aperture. The perimeter has a second radius equal to the first radius. The particular distance is less than the second radius. The leaves may deform in response to airflow. The second aperture has a first diameter and first depth in an un-deformed state, and a second diameter and second depth in a deformed state. The second diameter and second depth are greater than the first diameter and first depth.

14 Claims, 5 Drawing Sheets

RESILIENT DEFORMABLE AIR VALVE

BACKGROUND

This disclosure is in the field of cooling systems for air enclosures for apparatus and components that generate heat and electromagnetic radiation, and, more specifically, the field of air valves for enclosures that employ forced air for cooling electronic components.

Electronic components, such as computer systems, are typically housed in a case, chassis, or other enclosure. In a data center, computer system cases may be stacked in a rack, e.g., a rack of servers. Multiple racks may be placed side by side in a row and a data center may have many rows of server racks. The electronic components of computer systems generate heat and system enclosures commonly include one or more cooling fans and associated vents.

Some electronic components generate electromagnetic radiation. The electromagnetic radiation that particular electronic components generate may cause undesirable effects in other electronic components, as well as health effects. With respect to electronic components, these effects are commonly referred to as electromagnetic interference (EMI). It is desirable to ensure that electronic components will not interfere with or prevent the correct operation of other components outside of an enclosure, and will not cause undesirable health effects. Exposure standards, guidelines, and regulations pertaining to electromagnetic radiation generated by electronic components have been developed by various organizations. For example, the U.S. Federal Communications Commission and the European Union have enacted EMI regulations for various products.

Where multiple computer systems are placed in close proximity, e.g., stacked in racks in a data center, the dual needs for cooling and preventing EMI are especially acute. Moreover, methods for addressing these needs may conflict. Cooling needs may call for openings for air to flow into and out of a computer enclosure. Preventing EMI may call for minimizing or eliminating the size of vent openings.

SUMMARY

Embodiments are directed to an air valve for an air-cooled enclosure for an apparatus that generates heat and electromagnetic radiation. The enclosure may have a plurality of walls. The air valve may include a panel and a sheet. The panel may serve as at least a portion of one wall of the enclosure. The panel may have at least one substantially circular first aperture. The first aperture has a first radius.

The sheet may be provided on the panel. The sheet may be deformable and resilient. In addition, the sheet may have a conductive film on one surface. The sheet may have a second aperture. The second aperture may be defined by a plurality of leaves extending inwardly a particular distance from a substantially circular perimeter. The perimeter may have a second radius. The second radius may be substantially equal to the first radius. In addition, the particular distance may be less than the second radius.

The leaves may lie in a plane parallel to the panel. In addition, the second aperture may have a first diameter and a first depth in an un-deformed state. Further, the leaves may deform in response to air flow, flexing out of the plane. The second aperture may have a second diameter and a second depth in a deformed state. The second diameter may be greater than the first diameter. In addition, the second depth may be greater than the first depth.

In various embodiments, the sheet may be biaxially-oriented polyethylene terephthalate. In addition, the sheet has a thickness of approximately 0.2 millimeters. Further, the conductive film may be aluminum or nickel.

Various alternative embodiments are directed to an air valve for an air-cooled enclosure for an apparatus that generates heat and electromagnetic radiation. The enclosure may have a plurality of walls. The air valve may have a panel, and first and second sheets. The panel may serve as at least a portion of one wall of the enclosure. In addition, the panel may have at least one substantially circular first aperture. The first aperture may have a first radius. The first and second sheets may be provided on the panel. The first sheet may overlie the second sheet. The first and second sheets may each be deformable and resilient. In addition, each sheet may have a conductive film on one surface.

The first sheet may have a second aperture. The second aperture may be defined by a plurality of first leaves extending inwardly a first distance from a substantially circular first perimeter. The first perimeter may have a second radius substantially equal to the first radius. In addition, the first distance may be less than the second radius.

The second sheet may have a third aperture. The third aperture may be defined by a plurality of second leaves extending inwardly by the second distance from a substantially circular second perimeter. In addition, the second perimeter may have a third radius substantially equal to the second radius. Further, the second distance may be less than the second radius.

The first leaves and second leaves may lie in a plane parallel to the panel. The second and third apertures may have a first diameter and a first depth in an un-deformed state. The first leaves and second leaves may deform in response to air flow, flexing out of the plane. The second and third apertures may have a second diameter and a second depth in a deformed state. The second diameter may be greater than the first diameter. The second depth may be greater than the first depth. Moreover, the first leaves may be circumferentially offset from the second leaves.

In various embodiments, the sheet may be biaxially-oriented polyethylene terephthalate. In addition, the conductive film may be aluminum or nickel.

BRIEF DESCRIPTION OF THE DRAWINGS

Like reference numbers and designations in the various drawings indicate like elements. Dimensions of various aspects of the drawings are intended to be representative and may not be to scale.

DETAILED DESCRIPTION

Embodiments may be used in the context of an enclosure for an apparatus that generates heat and electromagnetic radiation, such as a computer system. The enclosure typically has a plurality of walls, e.g., top, bottom, front, back, and side walls. In addition, the enclosure typically employs forced air for cooling electronic components. For example, the enclosure may house a fan to cool heat generating components.

Figure 1:
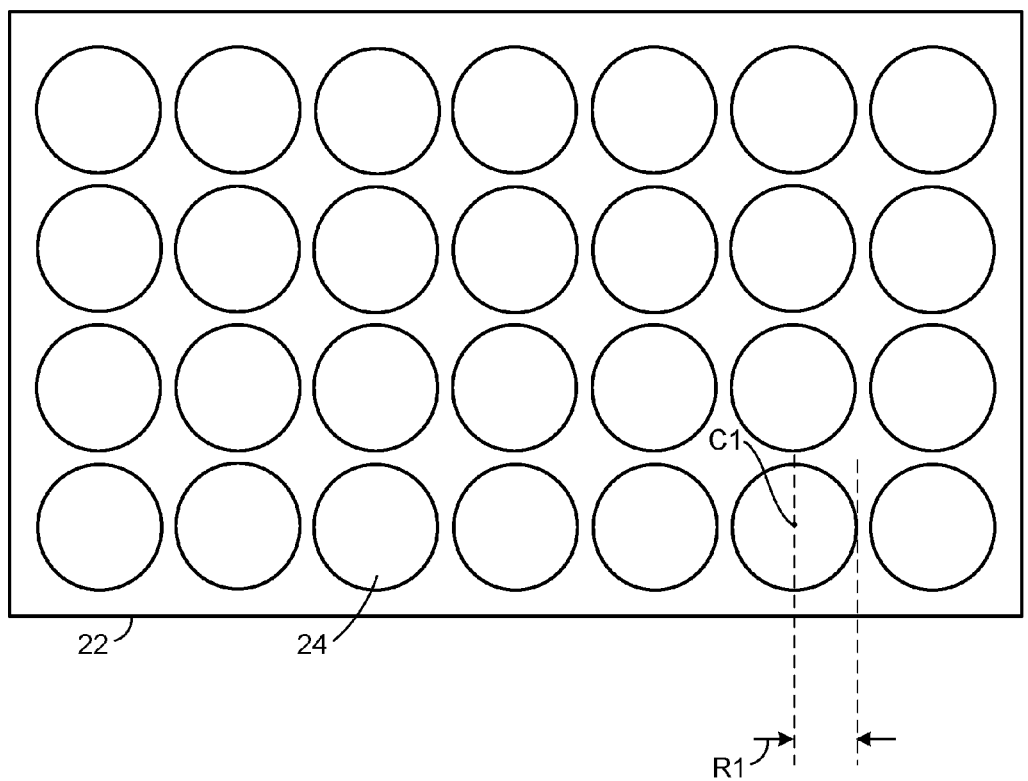
FIG. 1 is a front side view of an exemplary panel for a plurality of exemplary air valves, according to various embodiments.

Embodiments are directed to one or more air valves 20 defined in a wall of an enclosure for components that generate heat and electromagnetic radiation. In particular, a panel may be provided that serves as at least a portion of one of the walls of the enclosure. FIG. 1 is a front side view of an exemplary panel 22 for a plurality of exemplary air valves, according to various embodiments. The panel 22 may be generally planar and formed from a thin sheet of sheet metal, plastic, or other suitable material. The panel 22 may have at least one, and typically a plurality, of substantially circular first apertures 24. A first aperture 24 may have a first radius R1. For reference purposes, FIG. 1 shows a location of an approximate center C1 of the first aperture 24. The number of first apertures typically corresponds with the number of air valves desired in a particular embodiment. The first apertures 24 may be arranged in any suitable pattern. The first apertures 24 may all be of the same size or they may be of a variety of sizes.

Figure 2A:
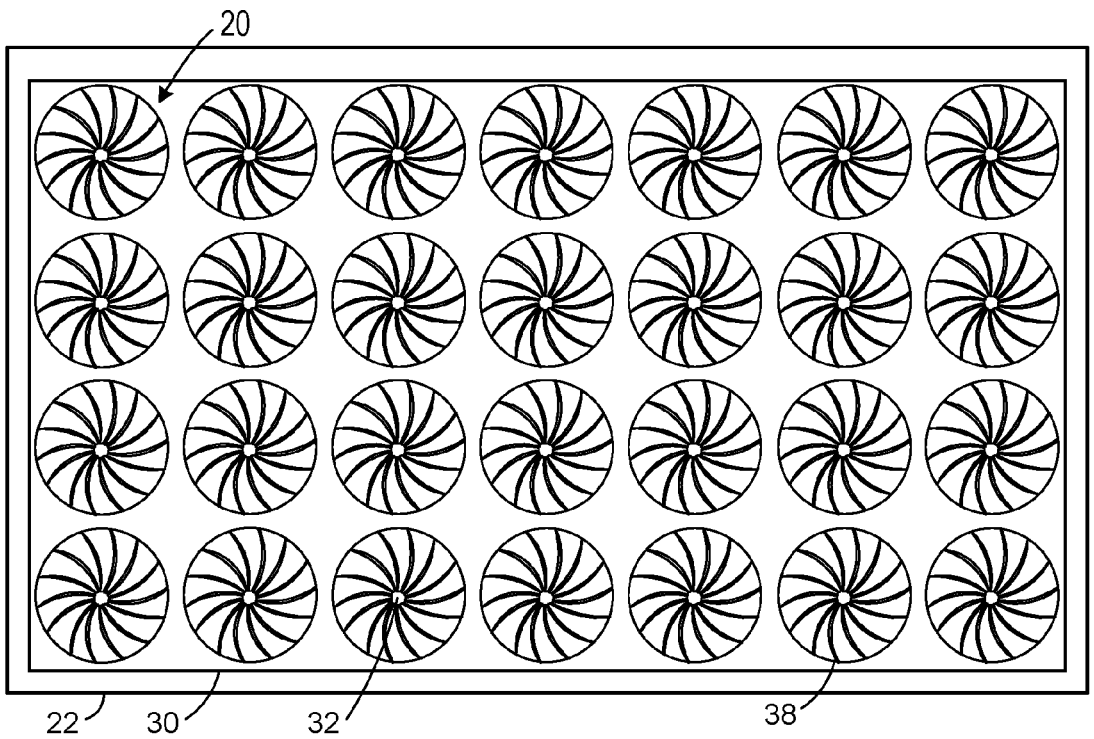
FIG. 2A is a front side view of an exemplary sheet that may be provided on the panel of FIG. 1 to form an exemplary air valve shown in an un-deformed state, according to various embodiments.
Figure 2B:
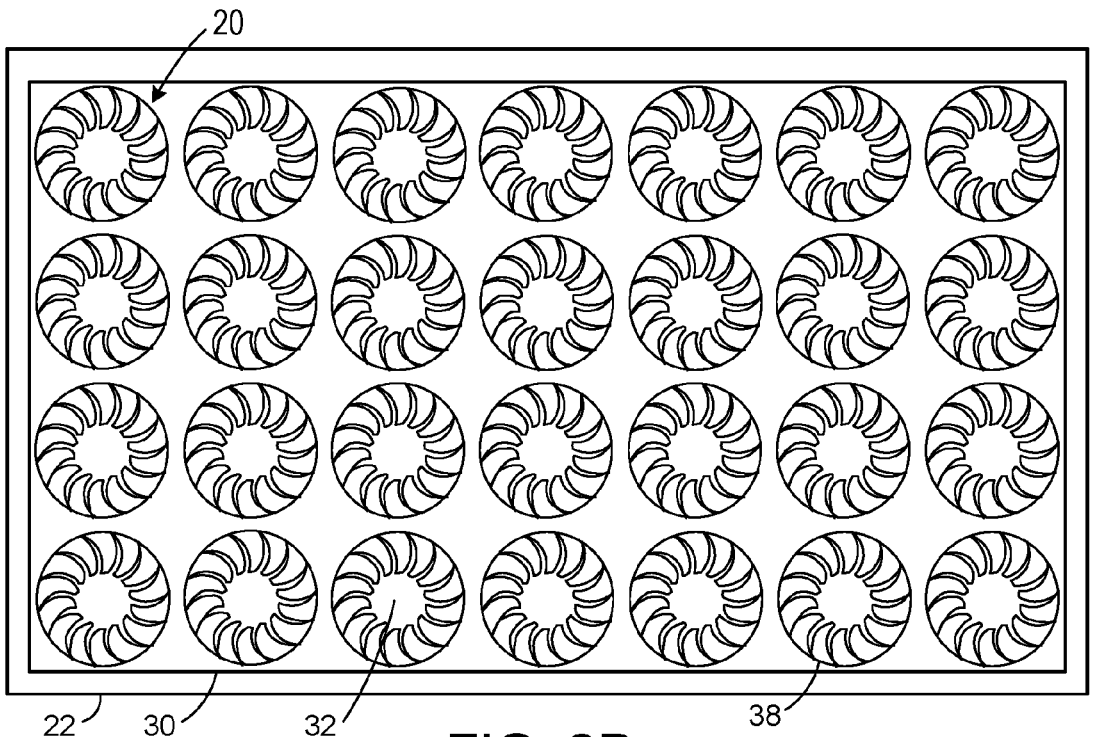
FIG. 2B is a front side view of an exemplary sheet that may be provided on the panel of FIG. 1 to form an exemplary air valve shown in a deformed state, according to various embodiments.

A sheet may be provided on the panel 22. FIGS. 2A and 2B are front side views of an exemplary sheet 30 that may be provided on the panel 22, according to various embodiments. The sheet 30 in conjunction with the panel 22 are employed to form exemplary air valves 20. In FIG. 2A, the exemplary air valves 20 are shown in an un-deformed state in which a second aperture 32 is provided with a diameter that is relatively small or nearly zero and which provides a relatively high impedance to air flow. In FIG. 2B, the exemplary air valves 20 are shown in an deformed state in which the second aperture 32 is provided with an increased diameter and which provides an impedance to air flow that is decreased in comparison to the un-deformed state.

Figure 5:
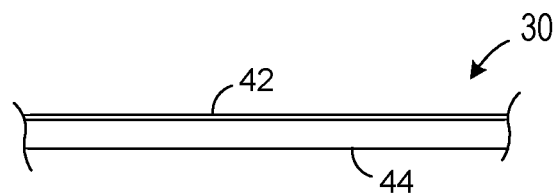
FIG. 5 is a cross-sectional view of the sheet of FIGS. 2A and 2B, according to various embodiments.

The sheet 30 may be deformable and resilient. In various embodiments, the sheet 30 may be biaxially-oriented polyethylene terephthalate. In various embodiments, the sheet 30 may have a thickness of approximately 0.20 mm. Further, as may be seen in FIG. 5, the sheet 30 may have a thin metal or other conductive film 42 on one surface. An electromagnetic field generated by a component on one side of the sheet 30 may be reduced on an opposite side of the sheet 30 as a result of the conductive film. In various embodiments, the conductive film may be formed by vapor deposition of Aluminum or Nickel powder. In addition, the sheet 30 may have an adhesive layer 44 to facilitate mounting the sheet on the panel 22.

As may be seen in FIGS. 2A and 2B, the sheet 30 has at least one second aperture 32. In the shown embodiment, the sheet 30 has the same number of second apertures 32 as the panel 22 has first apertures 24. In addition, each air valve 20 may have a substantially circular perimeter 38. Comparing FIGS. 2A and 2B, it may be seen that a diameter of a second aperture 32 in an un-deformed state (FIG. 2A) is smaller than a diameter of second aperture 32 in a deformed state (FIG. 2B). The un-deformed state may generally correspond with an absence of air flow, e.g., a fan is off, and the deformed state may generally correspond with a presence of air flow, e.g., the fan is on. This aspect is also shown in, and further explained with respect to, FIGS. 3A and 3B and FIGS. 4A and 4B.

Figure 3A:
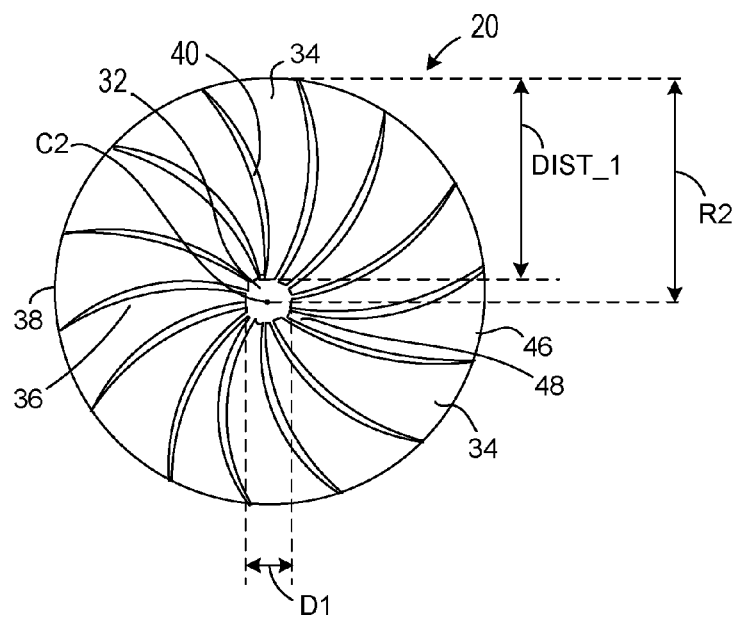
FIG. 3A shows an exemplary air valve in an un-deformed state, according to various embodiments.
Figure 3B:
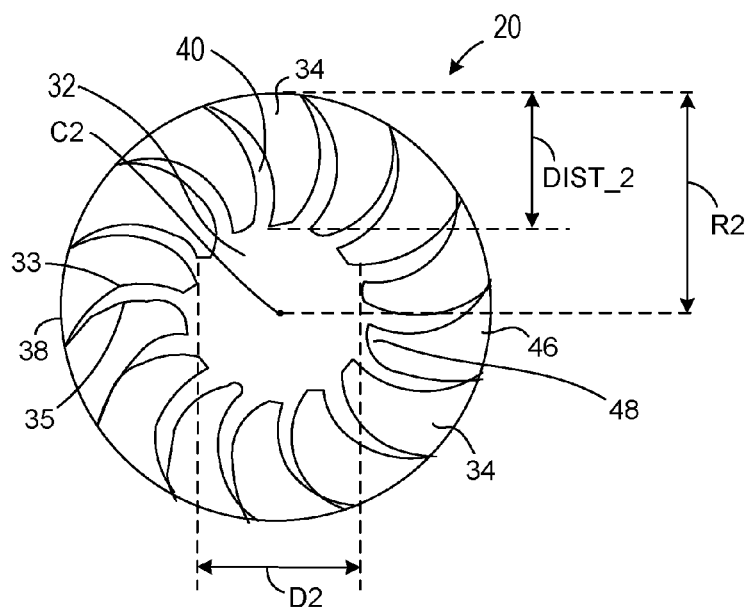
FIG. 3B shows the exemplary air valve in a deformed state, according to various embodiments.

FIG. 3A shows an exemplary air valve 20 in an un-deformed state, according to various embodiments. FIG. 3B shows the exemplary air valve 20 in a deformed state, according to various embodiments. In FIG. 3A, it may be seen that the second aperture 32 is defined by a plurality of leaves 34 extending radially inwardly a first distance "DIST_1" from the substantially circular perimeter 38. The circular perimeter 38 has a second radius R2, which may be substantially equal to the first radius R1 of the first aperture 24 of the panel 22, as shown in FIG. 1. (When the sheet 30 is placed on the panel 22, it may be positioned so that the circular perimeters 38 of the air valves 20 are aligned with the first apertures 24.) In an un-deformed state, the leaves 34 may lie in the plane (not shown in FIG. 3A) of the panel 20 or in a plane substantially parallel to the panel 20. The first distance DIST_1 is generally a distance in a two-dimensional plane (not shown), such as a plane that the panel 22 lies in or a plane substantially parallel to the panel 20.

In FIG. 3B, it may be seen that the second aperture 32 is defined by the plurality of leaves 34 extending inwardly a second distance "DIST_2" from the substantially circular perimeter 38. As mentioned, FIG. 3B shows the exemplary air valve 20 in a deformed state. In addition, as mentioned, it should be understood that the second distance DIST_2 is a distance in a two-dimensional plane (not shown), such as a plane that the panel 22 lies in or a plane substantially parallel to the panel 20. The first and second distances DIST_1, DIST_2 are different because the leaves 34 flex in a direction perpendicular to the plane of the panel 22 or perpendicular to a plane substantially parallel to the panel 20. (In various embodiments, the direction may be either into or out of the page of FIGS. 3A and 3B.) The lengths of the leaves 34 do not change between a deformed and an un-deformed state.

For reference purposes, FIGS. 3A and 3B show a location of an approximate center C2 of the substantially circular perimeter 38. In addition, in FIGS. 3A and 3B shows that a leaf 34 may have a base end 46 at the perimeter 38 and an opposite, inner end 48. It may be seen that the first and second distances DIST_1, DIST_2 that the leaves 34 extend inwardly may be less than the second radius R2 of the circular perimeter 38. In other words, the leaves 34 may extend radially inwardly by a distance that is less than the distance needed to reach the approximate center C2 of the circular perimeter 38. The second aperture 32 is located at the inward ends of the leaves 34.

As shown in FIG. 3A, in an un-deformed state, the second aperture 32 has a first diameter D1. As shown in FIG. 3B, in a deformed state, the second aperture 32 may have a second diameter D2. In response to air flow, the leaves 34 may deform in varying degrees corresponding with the strength of the air flow, flexing out of the plane they lie in in their undeformed state. When the leaves 34 deform, the first diameter D1 increases to a second diameter D2 and the second diameter D2 is greater than the first diameter D1. In other words, the inner ends of each of the plurality of leaves may be axially deformable (such as along an axis passing through center C2 and substantially perpendicular to a plane of the panel 22) in order to modify the second diameter of the second aperture 32. It should be recognized that there may be multiple "second diameters" D2 corresponding with the strength of the air flow and the extent of the flexing. The larger second diameter allows air to enter or exit the enclosure at a greater rate. In various embodiments, the second diameter D2 may be approximately forty to sixty percent of the second radius R2.

Each of the leaves 34 includes a base end 46 at the perimeter 38 and an opposite, inner end 48. The inner end 48 may be narrower than the base end 46. In addition, the plurality of leaves 34 may define a corresponding plurality of openings or gaps 40 between the leaves 34. Further, the leaves 34 may be curved, as shown in the figures, having concave side edge 33 and convex side edges 35 (see FIG. 3B). The leaves 34 may be provided with any suitable degree of curvature. In alternative embodiments, the leaves 34 may be provided with straight edges without a curvature. Further, the base ends 46 of the leaves 34 may be a curved segment of the substantially circular perimeter 38 as shown in the FIGS. 3A and 3B. Alternatively, the base ends 46 of the leaves 34 may be straight segments of the substantially circular perimeter 38, e.g., the perimeter 38 may be a regular polygon having relatively short sides of a number corresponding with the number of leaves 34 in an embodiment.

Figures 4A, 4B:
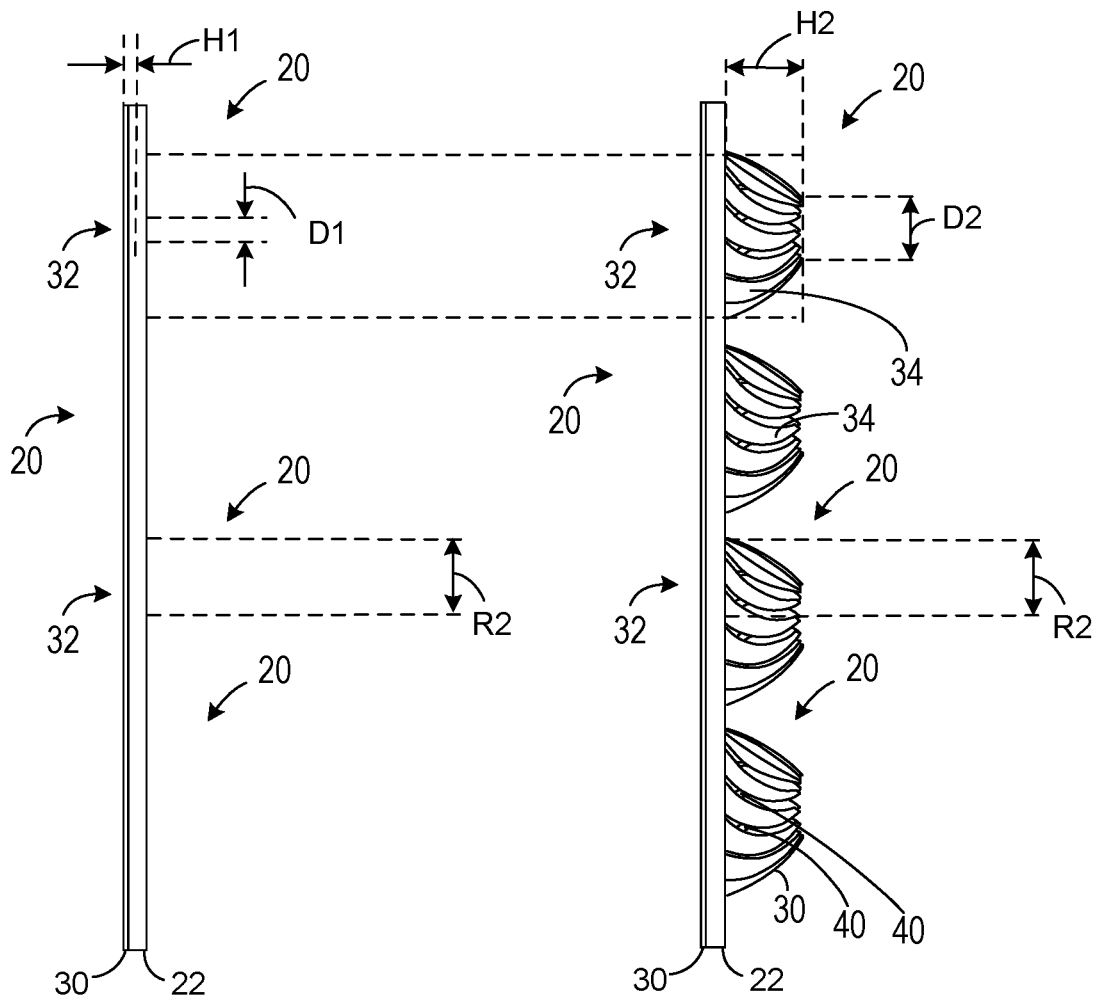
FIG. 4A is a left side view of the panel and sheet showing exemplary air valves in un-deformed states, according to various embodiments.
FIG. 4B is a left side view of the panel and sheet showing exemplary air valves in deformed states, according to various embodiments.

FIGS. 4A and 4B are a left side view of the panel 22 and sheet 30 showing exemplary air valves 20 in un-deformed and deformed states, respectively. In addition to the first and second diameters D1, D2 of the second aperture 32 described above, the air valves 20 may have a first depth or height H1 in an un-deformed state and a second depth or height H2 in a deformed state. In an un-deformed state, when air flow is nil or light, the second aperture 32 of the air valve 20 may be small, having a diameter D1 of nearly zero and the air valve may 20 be substantially planar, having a depth H1 less than or approximating the combined thickness of the panel 22 and sheet 30. The relatively small diameter D1 of the second aperture 32 in the undeformed state, together with the conductive film on the sheet 30, may provide effective EMI shielding. In various embodiments, the first diameter D1 may be approximately one to five percent of the second radius R2. In other embodiments, the first diameter D1 may be approximately ten percent of the second radius D2. As air flow increases, such as when a fan turns on, the diameter of second aperture 32 increases to diameter D2. In addition, when the leaves 34 deform and flex out, the first depth H1 may increase to a second depth H2. The second depth H2 may be greater than the first depth H1. In various embodiments, the second depth H2 may be approximately forty to fifty percent of the second diameter D2. As the leaves 34 flex out of the plane of the panel 22, they form a funnel shape in response to air flow. This funnel- or tunnel-like structure that the air valve takes improves EMI shielding properties, which may partially or completely offset any degradation of shielding properties caused by the increased diameter of the second aperture 32. In some embodiments, as the diameter of the second aperture 32 increases, the increase in depth of the tunnel more than makes up for the shielding effectiveness lost in the increased diameter of the second aperture 32.

As noted above, there may be multiple "second diameters" D2 corresponding with the strength of the air flow. Similarly, it should be recognized that there may be multiple "second depths" H2 corresponding with the strength of the air flow. Further, when air flow lessens or stops, leaves 34 that were deformed in response to the air flow may return to the un-deformed state, i.e., the second aperture 32 may return to having a first diameter D1 and first depth H1, as a result of the resiliency of the sheet. Accordingly, embodiments are directed to an air valve having an aperture of varying diameter and depth.

As described above, the leaves 34 may flex in a direction perpendicular to the plane of the panel 22 or a plane substantially parallel to the panel 20. In various embodiments, the leaves 34 may flex either into or out of the plane. In some embodiments, such as where flexing in both directions is not desired, the direction of flexing may be controlled by providing a fixed screen adjacent to the panel 20.

Referring again to FIGS. 3A, 3B, and 4B, it may be seen that there may be gaps 40 between the leaves 34. The size of the gaps 40 may vary in different embodiments and may vary with the degree by which the leaves 34 flex. The inventors have recognized that so long as the distance resulting from the gaps 40 between the conductive leaves is much smaller than a wavelength of a frequency of concern, the barrel-like or "deep hole" structure provided by the air valves 20 greatly improves the shielding effectiveness of each hole. Accordingly, various embodiments are directed to air valves 20 in which distances resulting from the gaps 40 between the conductive leaves are smaller than a wavelength of a frequency of concern. Exemplary wavelengths may include those associated with frequencies up to 15 to 40 GHz (20 mm to 7.5 mm).

Figure 6:
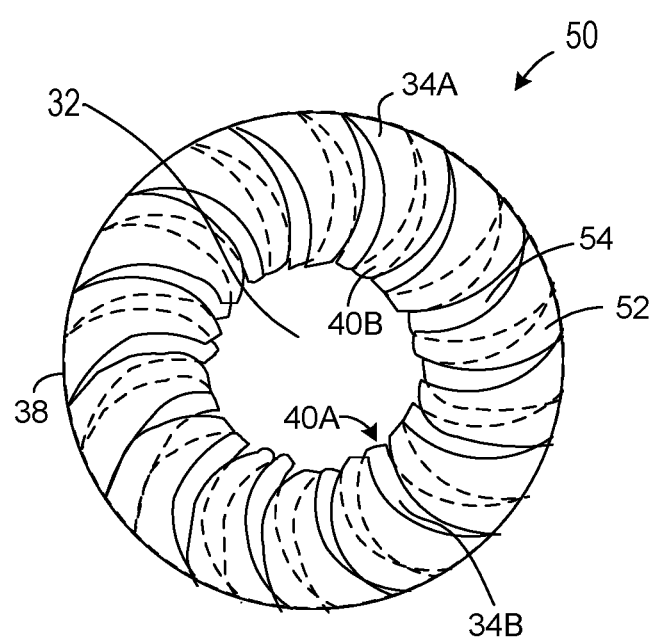
FIG. 6 shows an exemplary air valve in which a first sheet overlaying a second sheet are provided on the panel of FIG. 1, according to various embodiments.

FIG. 6 illustrates one alternative embodiment of an exemplary air valve 50 in which gaps 40 between the leaves 34 may be eliminated. In the shown embodiment, two sheets 30 are provided on the panel 22, namely a "top" sheet 52 that overlies a "bottom" sheet 54. The second apertures 32 of sheets 52, 54 may be similarly sized and aligned. However, the leaves 34A of the top sheet 52 may be circumferentially offset with respect to the bottom leaves 34B of the bottom sheet 54 so that when viewed from a side, as shown in FIG. 6, first areas of top leaves 34A overlap with gaps 40B between bottom leaves 34B and second areas of bottom leaves 34B overlap with gaps 40A between top leaves 34A.

A variety of examples are presented in this Detailed Description. These examples may be referred to as exemplary. Note that the term "exemplary," as used in this Detailed Description, simply means an example, instance, or illustration. This term is not used to mean that a particular example is superior, commendable, or otherwise deserving of imitation over other examples.

While the foregoing is directed to exemplary embodiments, other and further embodiments of the invention may be devised without departing from the basic scope thereof, and the scope thereof is determined by the claims that follow.

What is claimed is:

1. An air valve for an air-cooled enclosure for an apparatus that generates heat and electromagnetic radiation, the enclosure having a plurality of walls, comprising:
   a panel to serve as at least a portion of one wall of the enclosure, the panel having at least one circular first aperture, the first aperture having a first radius;
   first and second sheets on the panel, the first sheet overlying the second sheet, the first and second sheets each being deformable and resilient, and each having a conductive film on one surface;
   the first sheet having a second aperture, the second aperture being defined by a plurality of first leaves extending inwardly a first distance from a circular first perimeter, the first perimeter having a second radius equal to the first radius, the first distance being less than the second radius;

the second sheet having a third aperture, the third aperture being defined by a plurality of second leaves extending inwardly by a second distance from a circular second perimeter, the second perimeter having a third radius equal to the second radius, the second distance being less than the second radius;

wherein the first leaves and second leaves lie in a plane parallel to the panel and the second and third apertures have a first diameter and a first depth in an un-deformed state;

wherein each of the first and second leaves is curved, having a concave side edge and an opposite convex side edge extending inwardly from the base end at the perimeter towards the center point of the first aperture, the concave side edge and convex side edge of each leaf meeting at a rounded point to create the opposite, inner end; and wherein the first leaves and second leaves deform in response to air flow, flexing out of the plane, the second and third apertures having a second diameter and a second depth in a deformed state, the second diameter being greater than the first diameter and the second depth being greater than the first depth; and wherein the first leaves are circumferentially offset from the second leaves.

2. The air valve of claim 1, wherein the second depth is fifty percent of the second diameter of the second aperture.

3. The air valve of claim 1, wherein the first diameter is one percent of the second radius of the perimeter.

4. The air valve of claim 1, wherein the first diameter is ten percent of the second radius of the perimeter.

5. The air valve of claim 1, wherein the second diameter of the second aperture is sixty percent of the second radius of the perimeter.

6. The air valve of claim 1, wherein each of the first and second leaves includes a base end at the perimeter and an opposite, inner end, wherein the inner end of each of the first and second leaves is axially deformable.

7. The air valve of claim 1, wherein each of the first and second leaves includes a base end at the perimeter and an opposite, inner end, wherein the inner end of each of the first and second leaves is narrower than the base end, and wherein the plurality of leaves define a corresponding plurality of openings between the leaves, the openings increasing in width with distance from the perimeter when in the un-deformed state.

8. The air valve of claim 1, wherein the first and second sheets are biaxially-oriented polyethylene terephthalate.

9. The air valve of claim 1, wherein the first and second sheets are 0.2 millimeter thick biaxially-oriented polyethylene with the conductive film on one side to reduce an electromagnetic field generated by the apparatus.

10. The air valve of claim 1, wherein the conductive film is aluminum.

11. The air valve of claim 1, wherein the conductive film is nickel.

12. The air valve of claim 1, wherein the panel has two or more circular first apertures, and wherein the first and second sheets overlie to form a corresponding aperture for each of the two or more circular first apertures in the panel.

13. The air valve of claim 1, wherein the first depth of the second aperture and the third aperture in the un-deformed state is less than the combined thickness of the panel and the first and second sheets.

14. An air valve for an air-cooled enclosure for an apparatus that generates heat and electromagnetic radiation, the enclosure having a plurality of walls, comprising:

a panel to serve as at least a portion of one wall of the enclosure, the panel having at least one circular first aperture, the first aperture having a first radius;

a first sheet and a second sheet adhesively attached on the panel, the first and second sheets being deformable and resilient, and having a conductive film on one surface;

the first and second sheets overlying to form a second aperture, the second aperture being defined by a plurality of first leaves associated with the first sheet and second leaves associated with the second sheet extending inwardly a particular distance from a circular perimeter, the perimeter having a second radius equal to the first radius, the particular distance being less than the second radius;

wherein each of the plurality of first and second leaves includes a base end at the perimeter and an opposite, inner end, and sides of adjacent first and second leaves abut each other at the base end at the perimeter;

wherein the first and second leaves are curved, having a concave side edge and an opposite convex side edge extending inwardly from the base end at the perimeter towards the center point of the first aperture, the concave side edge and convex side edge meeting at a rounded point to create the opposite inner end;

wherein the first and second leaves lie in a plane parallel to the panel and the second aperture has a first diameter and a first depth in an un-deformed state;

wherein the first and second leaves deform in response to air flow, transitioning to a deformed state, flexing out of the plane, the second aperture having a second diameter and a second depth in the deformed state, the second diameter being greater than the first diameter and the second depth being greater than the first depth;

wherein the second leaves cover gaps generated in between the first leaves when in the deformed state; and wherein the first and second leaves transition to the un-deformed state in response to an absence of air flow.

* * * * *